United States Patent
Cheng et al.

(10) Patent No.: US 9,397,218 B2
(45) Date of Patent: Jul. 19, 2016

(54) METHOD AND APPARATUS FOR MITIGATING EFFECTS OF PARASITIC CAPACITANCE IN SEMICONDUCTOR DEVICES

(71) Applicant: Marvell World Trade Ltd., St. Michael (BB)

(72) Inventors: Chuan-Cheng Cheng, Fremont, CA (US); Runzi Chang, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/567,971

(22) Filed: Dec. 11, 2014

(65) Prior Publication Data

US 2015/0194518 A1    Jul. 9, 2015

Related U.S. Application Data

(60) Provisional application No. 61/925,481, filed on Jan. 9, 2014.

(51) Int. Cl.
*H01L 29/78*    (2006.01)
*H01L 29/66*    (2006.01)
*H01L 29/423*   (2006.01)

(52) U.S. Cl.
CPC .......... *H01L 29/785* (2013.01); *H01L 29/4238* (2013.01); *H01L 29/66795* (2013.01)

(58) Field of Classification Search
CPC ............... H01L 21/82385; H01L 21/0334; H01L 21/3083; H01L 21/823431; H01L 29/42372; H01L 29/42376; H01L 29/42312; H01L 29/7855; H01L 29/7856; H01L 29/66795; H01L 29/785; H01L 29/7858; H01L 27/0886; H01L 2029/7858
See application file for complete search history.

(56) References Cited

U.S. PATENT DOCUMENTS

| | | | | |
|---|---|---|---|---|
| 6,020,617 A | * | 2/2000 | Jos | H01L 29/0692 257/344 |
| 2005/0184350 A1 | * | 8/2005 | Hayashi | H01L 29/4238 257/401 |
| 2012/0211802 A1 | | 8/2012 | Tamari | |

FOREIGN PATENT DOCUMENTS

| | | |
|---|---|---|
| DE | 102008023216 A1 | 12/2009 |
| WO | WO9853505 A2 | 11/1998 |

OTHER PUBLICATIONS

PCT Invitation to Pay Additional Fees mailed Mar. 11, 2015 for PCT application No. PCT/US2014/070070, 7 pages.

* cited by examiner

*Primary Examiner* — Armando Rodriguez

(57) ABSTRACT

Embodiments include a semiconductor device comprising: a gate layer comprising (i) a first section and (ii) a second section, wherein the gate layer is non-linear such that the first section of the gate layer is offset with respect to the second section of the gate layer; and a first contact and a second contact, wherein the first section of the gate layer is at (i) a first distance from the first contact and (ii) a second distance from the second contact, wherein the first distance is different from the second distance.

20 Claims, 11 Drawing Sheets

METHOD AND APPARATUS FOR MITIGATING EFFECTS OF PARASITIC CAPACITANCE IN SEMICONDUCTOR DEVICES

CROSS REFERENCE TO RELATED APPLICATIONS

The present disclosure claims priority to U.S. Provisional Patent Application No. 61/925,481, filed on Jan. 9, 2014, which is incorporated herein by reference in its entirety.

TECHNICAL FIELD

Embodiments of the present disclosure relate to a management of parasitic capacitance, and in particular to method and apparatus for mitigating effects of parasitic capacitance in semiconductor devices.

BACKGROUND

Semiconductor devices are becoming increasingly smaller in size. With the decrease in size, a distance between two components (e.g., a gate layer and a drain contact) of a semiconductor device also continues to decrease, leading to, for example, generation of parasitic capacitance between the two components. For example, parasitic capacitance between may be generated between a gate layer and a drain contact of a semiconductor device, due to, for example, a relatively small distance between the gate layer and the drain contact. Such parasitic capacitance may have undesirable effect while the semiconductor device is used, for example, in high frequency switching operation.

SUMMARY

In various embodiments, the present disclosure provides a semiconductor device comprising: a gate layer comprising (i) a first section and (ii) a second section, wherein the gate layer is non-linear such that the first section of the gate layer is offset with respect to the second section of the gate layer; and a first contact and a second contact, wherein the first section of the gate layer is at (i) a first distance from the first contact and (ii) a second distance from the second contact, wherein the first distance is different from the second distance.

In various embodiments, the present disclosure also provides a method of forming a semiconductor device, comprising: forming a gate layer, wherein the gate layer comprises (i) a first section and (ii) a second section, wherein the gate layer is non-linear such that the first section of the gate layer is offset with respect to the second section of the gate layer; and forming a first contact and a second contact, wherein the first section of the gate layer is at (i) a first distance from the first contact and (ii) a second distance from the second contact, wherein the first distance is different from the second distance.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Various embodiments are illustrated by way of example and not by way of limitation in the figures of the accompanying drawings.

DETAILED DESCRIPTION

Figure 1:
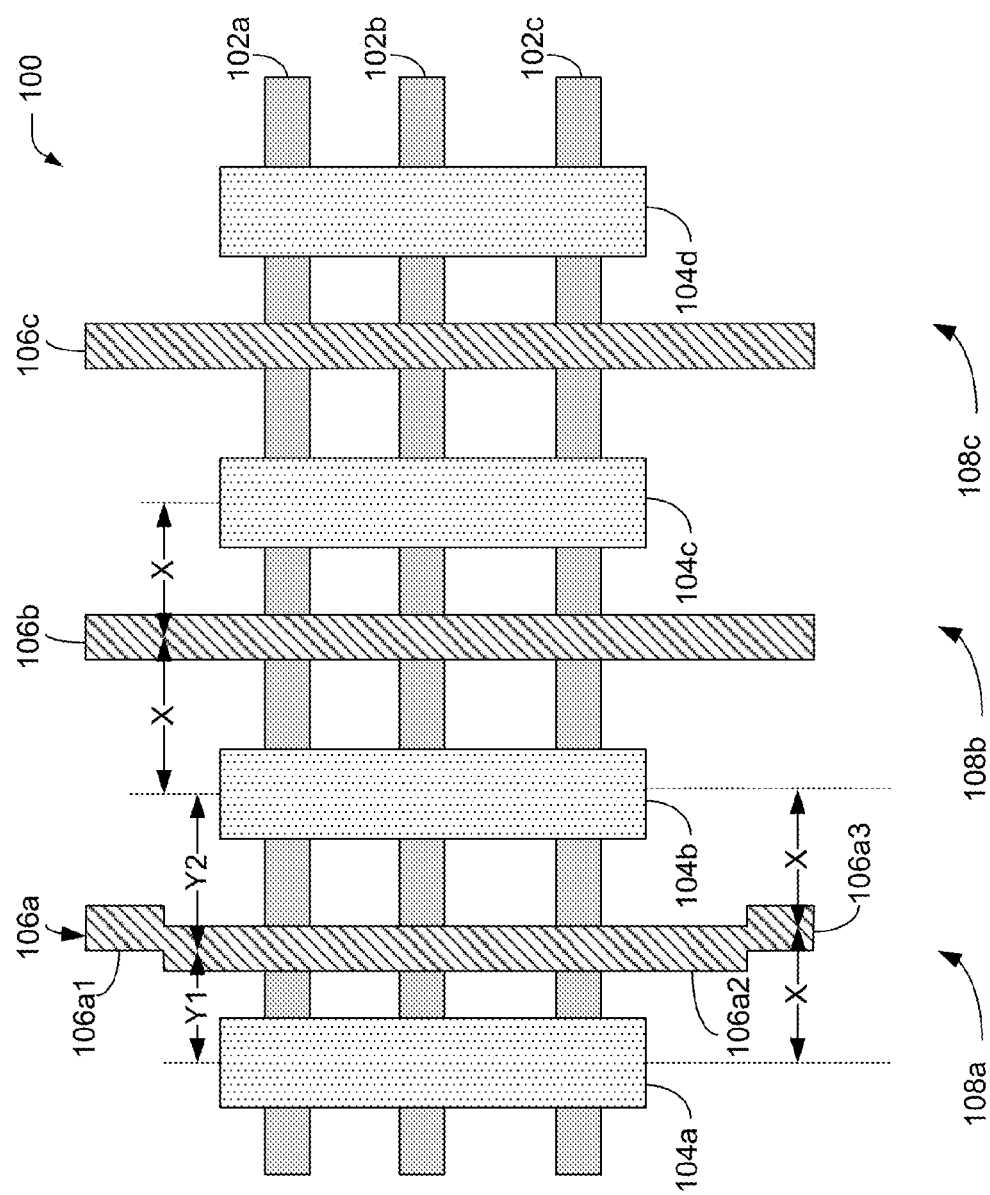
FIG. 1 schematically illustrates a top view of a semiconductor device having a non-linear gate layer.

FIG. 1 schematically illustrates a top view of a semiconductor device 100 (henceforth also referred to as "device 100") having a non-linear gate layer 106a. In an embodiment, the device 100 comprises, for example, a plurality of transistors.

In an embodiment, the device 100 comprises a plurality of diffusion layers 102a, 102b, 102c. In an example, the device 100 comprises a FinFET device, in which one or more of the diffusion layers 102a, 102b, 102c are fins of the device. In an example, the diffusion layers 102a, 102b, 102c are conducting channels, wrapped by thin silicon fin, to form a body of the device 100. In an example, individual ones of the diffusion layers 102a, 102b, 102c represents any appropriate region of the device 100, e.g., a source region, a drain region, or the like. Although three diffusion layers are illustrated in FIG. 1, the device 100 can have any different number of diffusion layers.

In an embodiment, the device 100 further comprises a plurality of contacts 104a, 104b, 104c and 104d. In an example, individual ones of the contacts 104a, 104b, 104c and 104d is a source contact or a drain contact. The contacts 104a, 104b, 104c and 104d are, for example, metal contacts that are coupled to corresponding regions. For example, although not illustrated in FIG. 1, individual ones of the contacts 104a, 104b, 104c and 104d is electrically connected to a corresponding one or more of the diffusion layers 102a, . . . , 102c. Although four contacts 104a, . . . , 104d are illustrated in FIG. 1, the device 100 may have any different number of contacts.

In an embodiment, the device 100 further comprises a plurality of gate layers 106a, 106b and 106c. In an example, one or more of the gate layers 106a, 106b and 106c comprises metal. In another example, one or more of the gate layers 106a, 106b and 106c comprises any other appropriate material, e.g., polysilicon (in case a gate layer comprises polysilicon, the gate layer may also be referred to as a poly gate layer).

In an example, the contacts 104a and 104b, and the gate layer 106a, along with one or more other components, form a first transistor 108a; the contacts 104b and 104c, and the gate layer 106b, along with one or more other components, form a second transistor 108b; and the contacts 104c and 104d, and the gate layer 106c, along with one or more other components, form a third transistor 108c. Thus, for example, the contact 104b is a part of both the first transistor 108a and the second transistor 108b. In an example, the contact 104b acts as a drain contact (e.g., contact for a drain region) for the first transistor 108a, and also acts as a source contact (e.g., contact for a source region) for the second transistor 108b. As individual ones of the contacts 104a, . . . , 104d can act as a source contact and/or a drain contact, the contacts 104a, . . . , 104d are also referred to herein as source/drain contacts.

In an embodiment, the gate layer 106b is formed substantially at equal distance from the adjacent contacts 104b and 104c. For example, a distance between the gate layer 106b and the contact 104b is X units (wherein X may have any appropriate value), and a distance between the gate layer 106b and the contact 104c is also substantially X units, as illustrated in FIG. 1. Similarly, the gate layer 106c is formed substantially at equal distance from the adjacent contacts 104c and 104d.

In an embodiment, the gate layer 106a has a non-linear shape. For example, the gate layer 106a comprises a section 106a1, a section 106a2 and a section 106a3. In an embodiment, the section 106a2 of the gate layer 106a is offset with respect to the sections 106a1 and 106a3 of the gate layer 106a. In an embodiment, the section 106a1 is not offset relative to the section 106a3. The sections 106a1 and 106a3 form two end portions of the gate layer 106a, while the section 106a2 forms a middle portion of the gate layer 106a, as illustrated in FIG. 1. In an example, a distance between the section 106a1 of the gate layer 106a and each of the contacts 104a and 104b is substantially equal to X units; and a distance between the section 106a3 of the gate layer 106a and each of the contacts 104a and 104b is also substantially equal to X units, as illustrated in FIG. 1. However, a distance between the section 106a2 of the gate layer 106a and the contact 104a is Y1 units; while a distance between the section 106a2 of the gate layer 106a and the contact 104b is Y2 units, where Y1 is different from Y2. In the example of FIG. 1, Y2 is higher than Y1 (i.e., the section 106a2 of the gate layer 106 is closer to the contact 104a, compared to the contact 104b). In an example, the contact 104b forms a drain contact of the first transistor 108a, and the contact 104a forms a source contact of the first transistor 108a. In an embodiment, based on the contact 104b forming the drain contact of the first transistor 108a, the distance Y2 is higher than the distance Y1.

In a semiconductor device comprising multiple transistors, one or more transistors may be more critical than one or more other transistors of the semiconductor device. For example, a critical transistor may be employed for a critical operation (e.g., for high speed and high frequency switching), and it may be desirable to reduce parasitic or Miller capacitance between a gate layer and an adjacent metal contact in the critical transistor. For example, it may be desirable to reduce parasitic capacitance or Miller capacitance between a gate layer and a drain contact of a critical transistor, e.g., compared to reducing parasitic capacitance between the gate layer and a source contact of the critical transistor.

In an example, the transistor 108a is a critical transistor (e.g., relative to the transistors 108b and 108c). For example, the transistor 108a may be used for a high speed and high frequency switching operation. As an example, it is desirable to reduce parasitic capacitance or Miller capacitance between the gate layer 106a and an adjacent contact in the transistor 108a (e.g., compared to reducing capacitance in transistors 108b and/or 108c). The parasitic or Miller capacitance between the gate layer 106a and an adjacent contact is based on a distance between the gate layer 106 and the adjacent contact. Also, it may be more desirable to reduce parasitic capacitance or Miller capacitance between the gate layer 106a and the drain contact 104b of the transistor 108a, e.g., compared to reducing parasitic capacitance or Miller capacitance between the gate layer 106a and the source contact 104a of the transistor 108a.

In an embodiment, forming the non-linear gate layer 106a results in an increase in a distance between the section 106a2 of the gate layer 106 and the contact 104b, while resulting in a decrease in distance between the section 106a2 of the gate layer 106 and the contact 104a. Also, in an example, the contact 104b acts as a drain contact for the transistor 108a. Accordingly, the parasitic or Miller capacitance between the gate layer 106a and the drain contact 104b of the transistor 108a is reduced, due to the non-linear shape of the gate layer 106a. The non-linear shape of the gate layer 106a also results in an increase in the parasitic or Miller capacitance between the gate layer 106a and the source contact 104a of the transistor 108a. However, as previously discussed herein, for high frequency operations, reduction of capacitance between a gate layer and a drain contact of a transistor is more critical (e.g., even if it results in an increase in the capacitance between the gate layer and the source contact of the transistor). Thus, the non-linear shape of the gate layer 106a results in a decrease in parasitic or Miller capacitance between the gate layer 106a and the drain contact 104b, and thereby improving a performance of the transistor 108a.

In an embodiment, formation of the device 100 is based on a database, and a design algorithm that controls formation of the device 100. For example, a system (not illustrated in the figures) comprises one or more a processors, and a non-transitory computer-readable storage medium (e.g., memory), wherein instructions are tangibly stored on the computer-readable storage medium. The instructions are executable by the one or more processors to enable the processors to control formation of the device 100. The database and the algorithm that controls formation of the device 100 may be stored on the computer-readable storage medium.

In an embodiment, the database stores data required for forming the device 100 (e.g., data that indicates forming various components of the device 100, the shapes and sizes of the components, the connections between the components, and/or the like). The database, for example, includes data that indicates formation of the gate layers 106a, 106b and 106c.

In an embodiment, the database also includes data that indicates that the gate layer 106a is to have a non-linear shape, and also includes data that indicates a side to which the middle portion of the gate layer 106s is to be shifted. For example, the database can include a two bit flag corresponding to each of the gate layers 106a, 106b and 106c. A first bit of the flag, for example, indicates whether the corresponding gate layer is to be linear or non-linear; and a second bit of the flag indicates, if the corresponding gate layer is non-linear, a direction in which the middle section of the corresponding gate layer is to be shifted. A 00 value of the flag, for example, indicates that the corresponding gate layer is to be linear. For example, the flags corresponding to the gate layers 106b and 106c have a value of 00. A 10 or 11 value of the flag indicates that the corresponding gate layer is to be non-linear. For example, a 10 value of the flag indicates that the corresponding gate layer is to be non-linear, and the middle section of the corresponding gate layer is to be shifted to the right; and a 01 value of the flag indicates that the corresponding gate layer is to be non-linear, and the middle section of the corresponding gate layer is to be shifted to the left. In the example of FIG. 1, the flag corresponding to the gate layer 106a has a value of 01.

Figure 2:
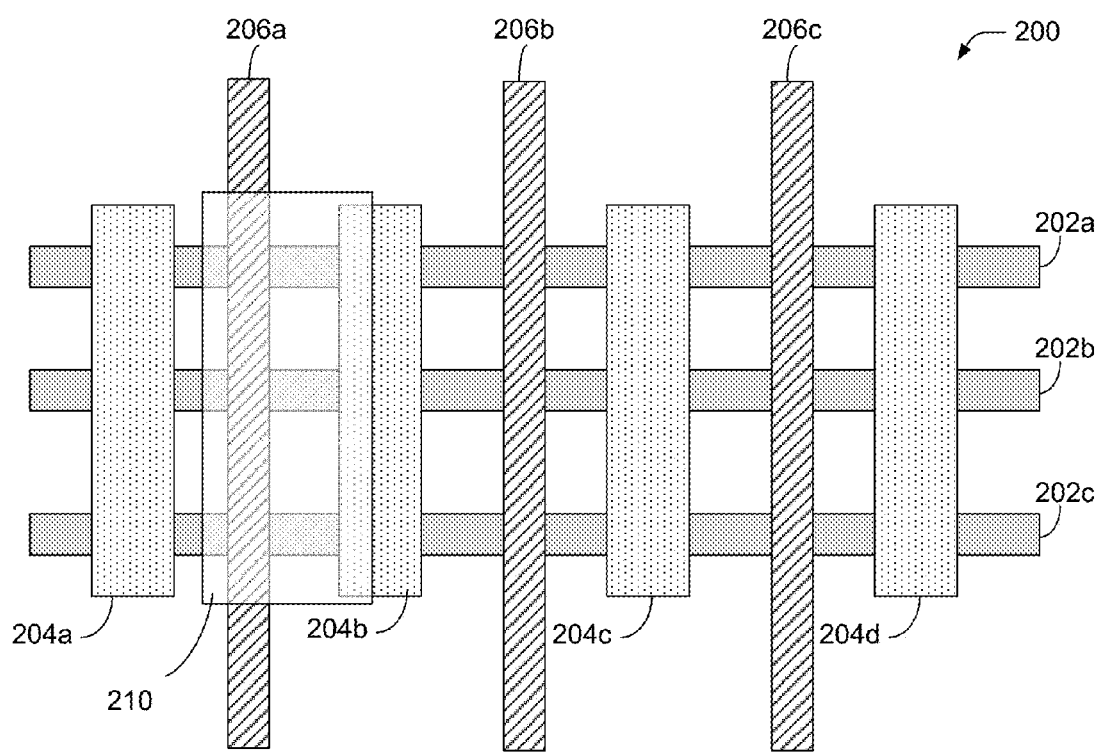
FIG. 2 illustrates a design of a semiconductor device, where the design comprises a linearity indication layer to indicate non-linearity of a gate layer.

In another example, instead of (or in addition to) a flag corresponding to a gate layer, any other type of data may be included in the database to indicate that a gate layer is to be non-linear. For example, in the database, for a gate layer that is to be formed non-linearly, a linearity indication layer is associated with the corresponding gate layer. FIG. 2 illustrates a design 200 of the device 100, as included in a database that is used to form the device 100, where the design 200 comprises a linearity indication layer 210 to indicate non-linearity of a gate layer. The design 200 includes diffusion layers 202a, 202b, 202c, contacts 204a, 204b, 204c and 204d, and gate layers 206a, 206b and 206c, which represent the corresponding components of the device 100. In the design 200, the gate layer 206a is designed to be a linear gate layer. The design 200 further comprises the linearity indication layer 210 that is superimposed over the gate layer 206a and the contact 204b. The linearity indication layer 210 acts as an indicator, to indicate that the gate layer 106a is to be non-linear while the device 100 is to be formed or fabricated, and also indicates that a middle section of the gate layer 106a is to be skewed away from the contact 104b in the device 100. The linearity indication layer 210 is a virtual layer—that is, the linearity indication layer 210 exists in the design 200 included in the database, but is not actually present in the device 100. The linearity indication layer 210 indicates that the corresponding gate layer (e.g., on which the linearity indication layer 210 is superimposed) is to be formed in a non-linear manner, as illustrated in FIG. 1. By using the linearity indication layer 210, e.g., instead of actually designing the gate layer 206a to have a non-linear shape in the design 200, may simplify the generation of the design 200 for the device 100. In an embodiment, the linearity indication layer 210 is an optical proximity correction (OPC) optimization layer.

FIGS. 3A-3F illustrate various operations associated with formation of the device 100 of FIG. 1. Similar to FIG. 1, FIGS. 3A-3F illustrate top views of the device 100, while the device 100 is being formed.

Figure 3A:
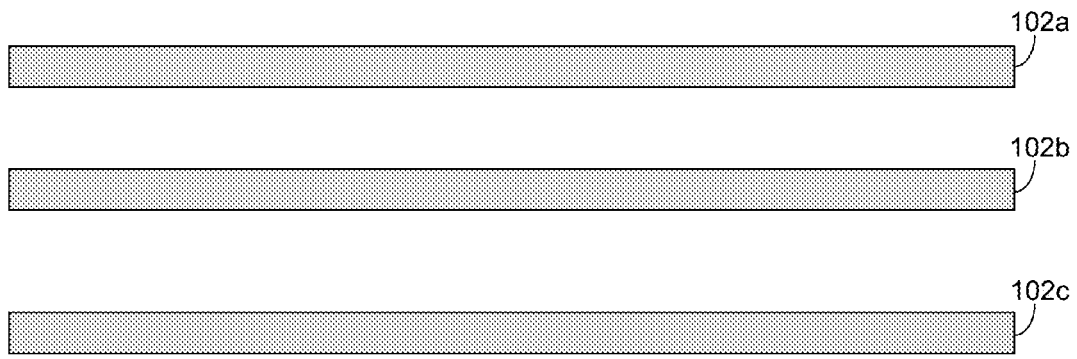
FIGS. 3A-3F illustrate various operations associated with formation of a semiconductor device.

Referring to FIG. 3A, a plurality of diffusion layers 102a, ..., 102c are formed. The diffusion layers 102a, ..., 102c may be formed using any appropriate operation for formation of such diffusion layers. Although not illustrated in the figures, the diffusion layers 102a, ..., 102c may be formed over any appropriate component or layer, e.g., may be formed over a substrate.

Figure 3B:
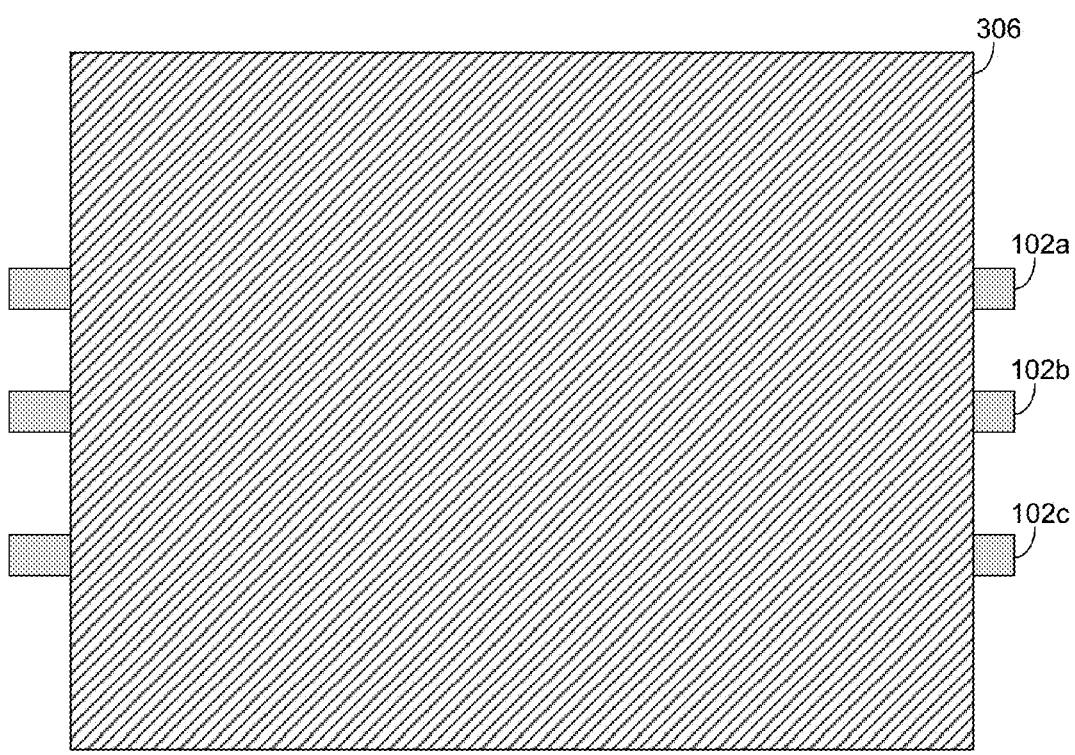

FIGS. 3B-3E are directed to formation of the gate layers 106a, ..., 106c. Referring to FIG. 3B, a layer 306 is deposited at least partially over the diffusion layers 102a, ..., 102c. In an example, the layer 306 comprises material that is used to form the gate layers 106a, ..., 106c. For example, if the gate layers 106a, ..., 106c comprises an appropriate metal, then the layer 306 comprises the metal. In another example, if the gate layers 106a, ..., 106c comprises polysilicon, then the layer 306 comprises polysilicon.

Figure 3C:
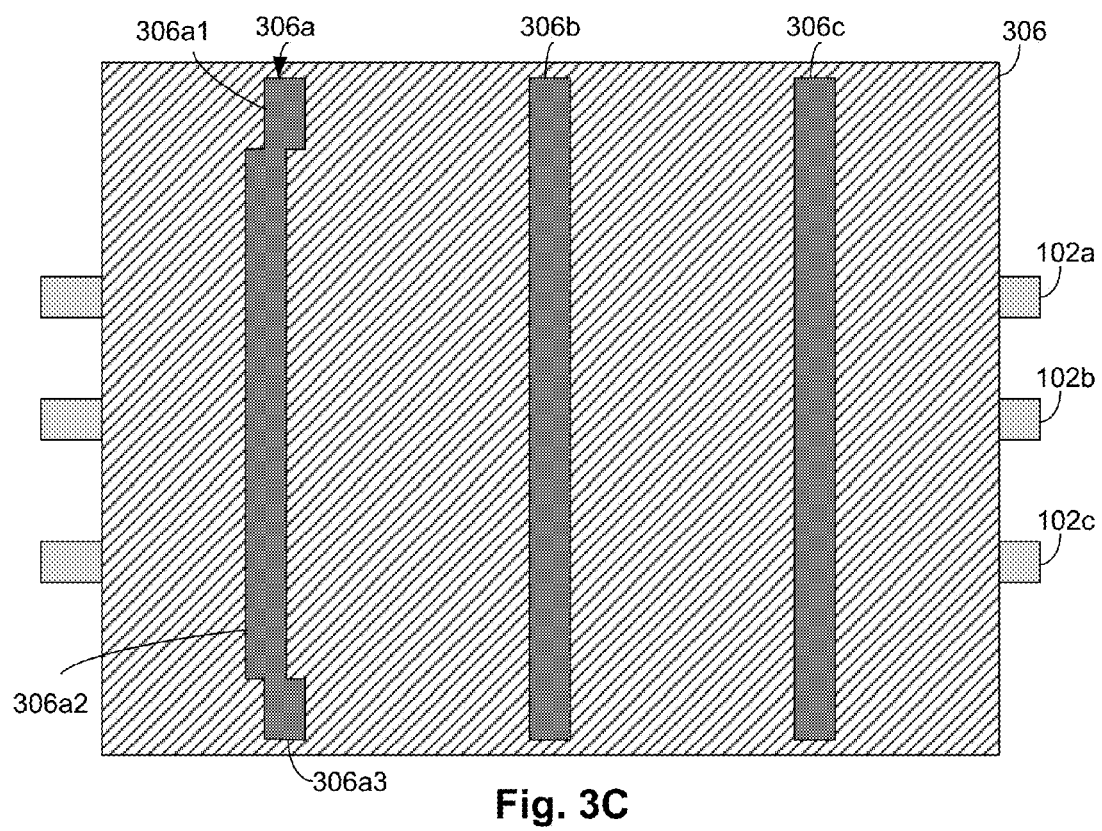

FIG. 3C illustrates deposition of mask layers 306a, 306b and 306c over the layer 306. The mask layers 306a, 306b and 306c may be formed using any appropriate operation for formation of such mask layers. In an example, the shape and position of the mask layers 306a, 306b and 306c respectively correspond to the shape and position of the gate layers 106a, ..., 106c. In an embodiment, the mask layers 306b and 306c are linearly shaped, while the mask layer 306a is shaped non-linearly corresponding to the shape of the gate layer 106a. For example, the mask layer 306a comprises sections 306a1, 306a2 and 306a3, which correspond to the respective sections 106a1, 106a2 and 106a3 of the gate layer 106a of FIG. 1.

In an example, the design 200 of FIG. 2 illustrates the linearity indication layer 210 formed over the gate layer 206a, and the mask layer 306a is shaped non-linearly based on the linearity indication layer 210 being formed over the gate layer 206a in the design 200. In another example, the mask layer 306a is shaped non-linearly, based on a flag associated with the gate layer 106a in the design of the device 100 indicating that the gate layer 106a is to be formed non-linearly (e.g., the flag having a value of 01), as previously discussed herein.

Figure 3D:
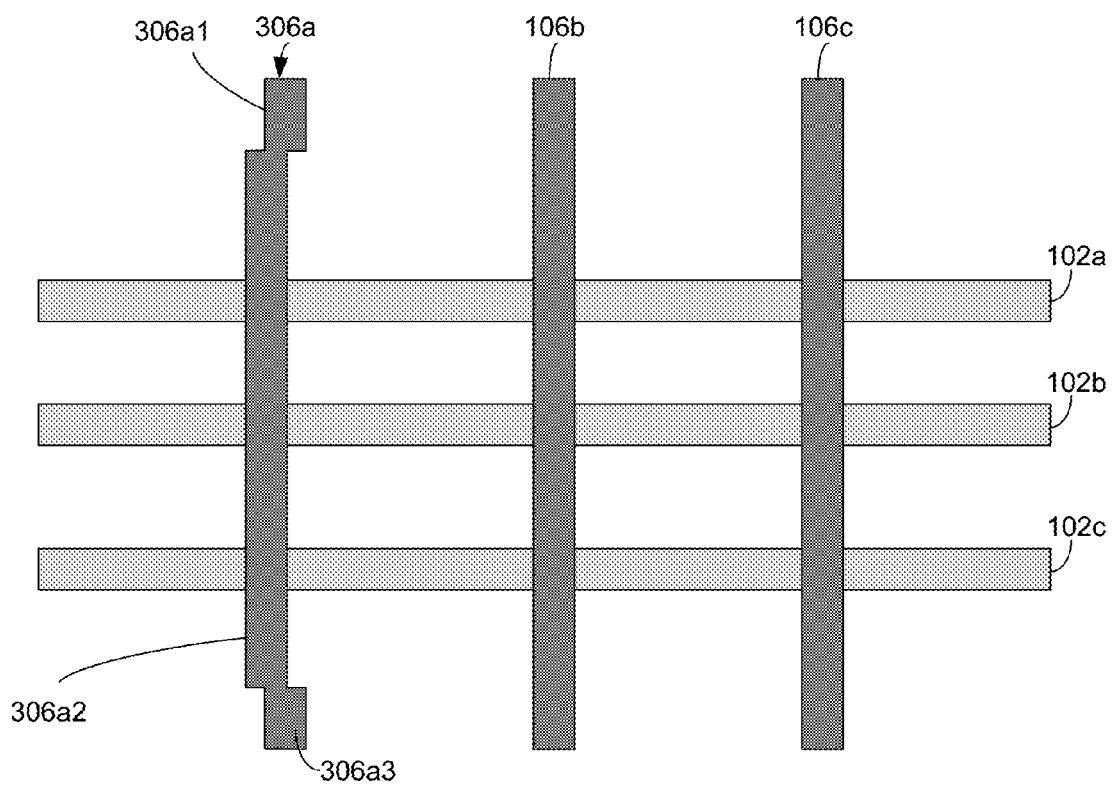
Figure 3E:
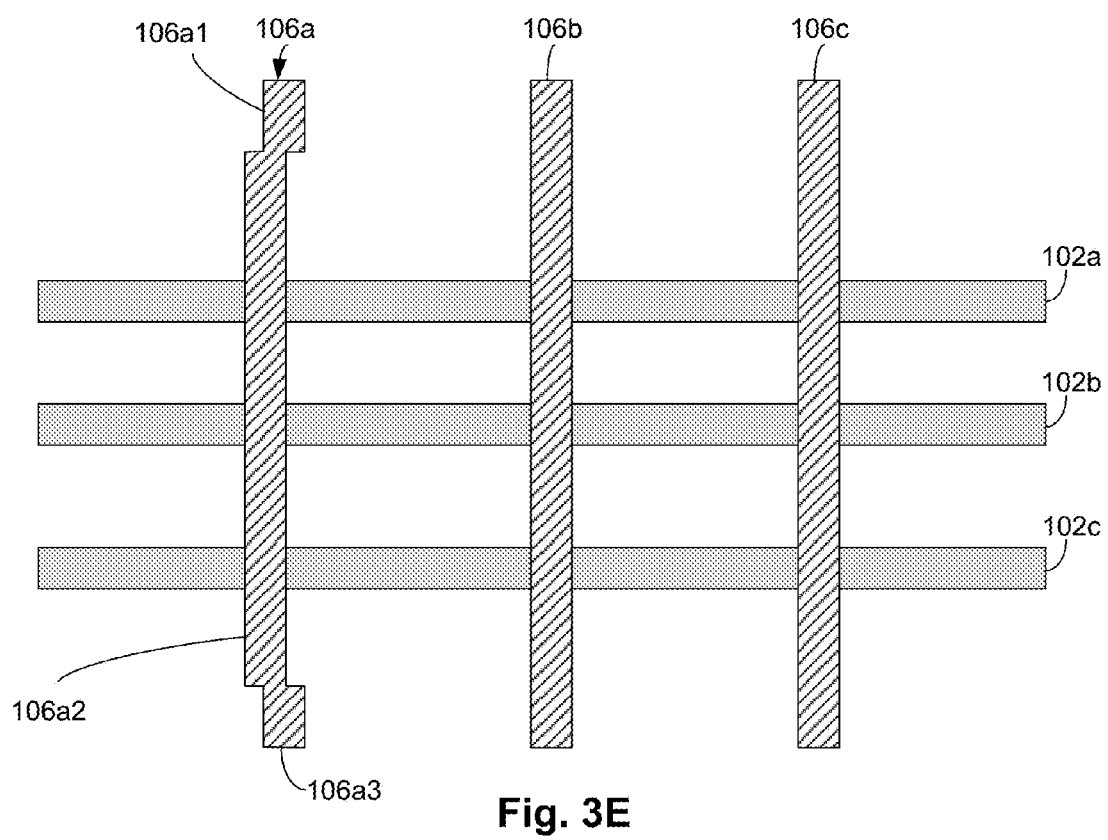

Subsequent to the deposition of the mask layers 306a, ..., 306c, the unexposed portions of the layer 306 is etched, as illustrated in FIG. 3D. While the layer 306 is being selectively etched, sections of the layer 306, which are covered by the mask layers 306a, ..., 306c, are not etched. Subsequent to the selective etching of the layer 306, the mask layers 306a, ..., 306c are etched, thereby forming the gate layers 106a, ..., 106c, as illustrated in FIG. 3E. Selective etching of the layer 306 and the mask layers 306a, ..., 306c can be performed using any appropriate manner (e.g., by employing laser etching, chemical etching, and/or the like).

Figure 3F:
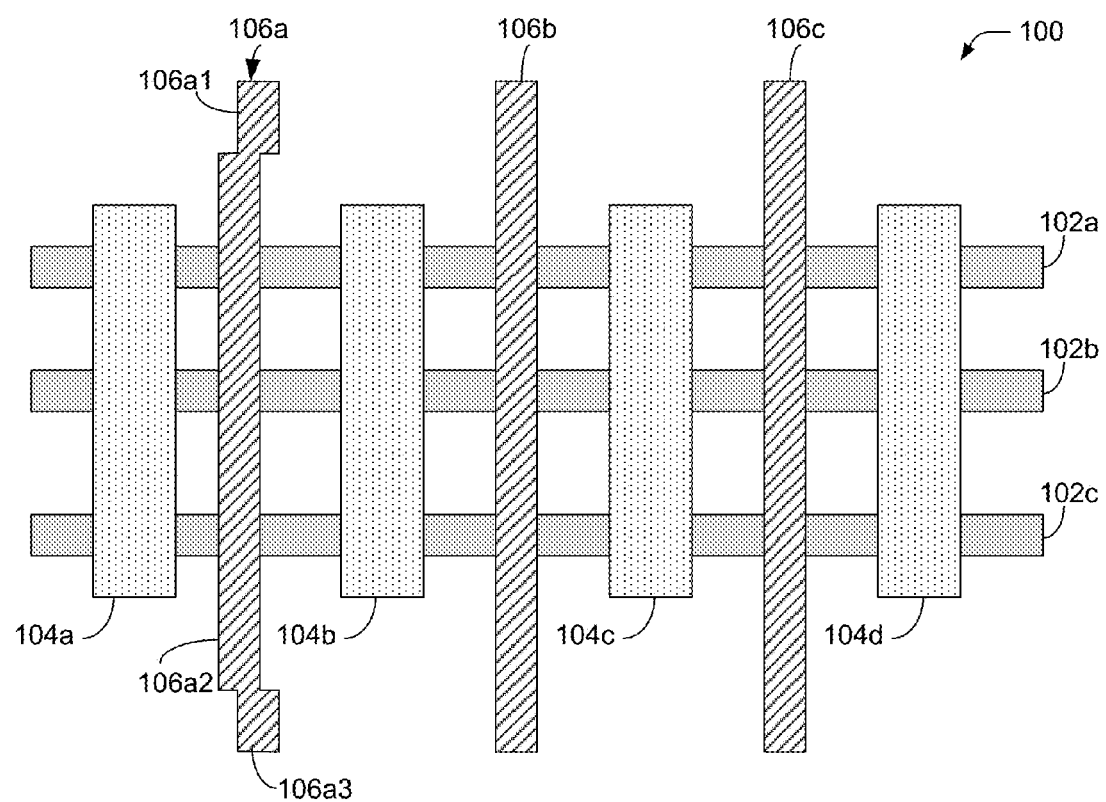

Once the gate layers 106a, ..., 106c are formed, the contacts 104a, ..., 104d are formed, as illustrated in FIG. 3F, thereby forming the device 100. Formation of the contacts 104a, ..., 104d may be performed by any appropriate operations used for forming such contacts. Although FIGS. 3A-3F illustrate formation of the contacts 104a, ..., 104d subsequent to formation of the gate layers 106a, ..., 106c, in another embodiment (and although not illustrated in the figures), the contacts 104a, ..., 104d may be formed prior to (or along with) formation of the gate layers 106a, ..., 106c.

Figure 4A:
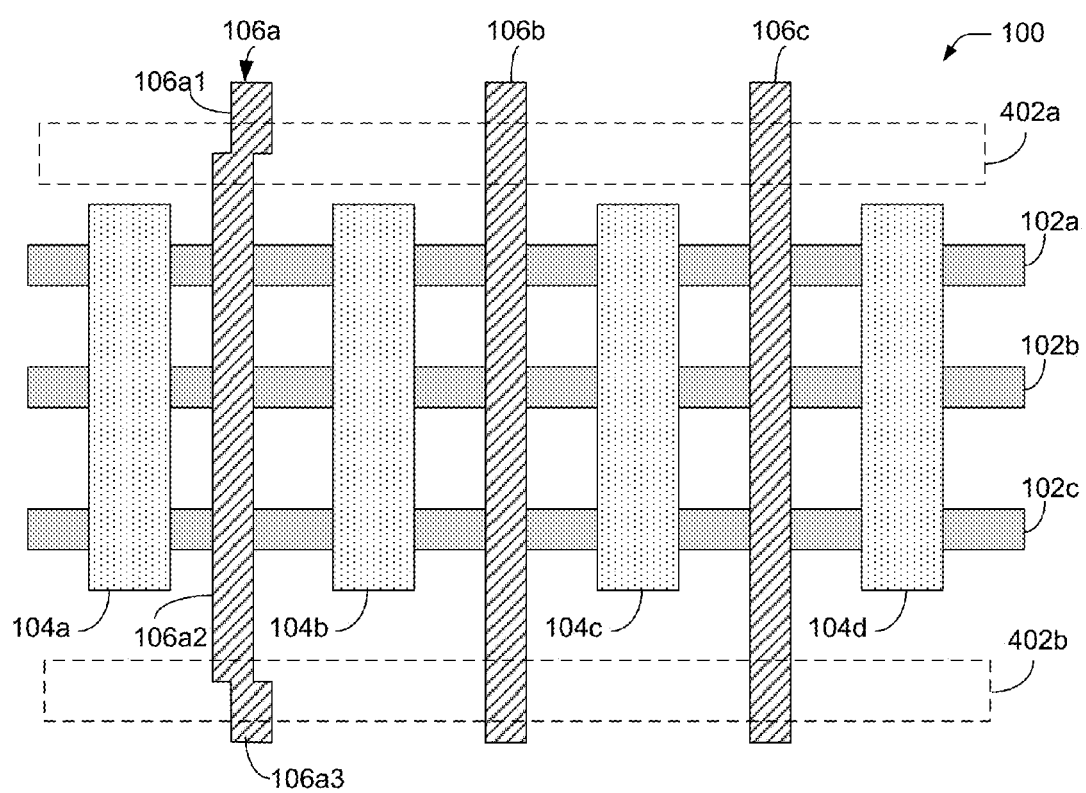
FIGS. 4A and 4B illustrate a semiconductor device, with sections of a gate layer of the semiconductor device being cut.
Figure 4B:
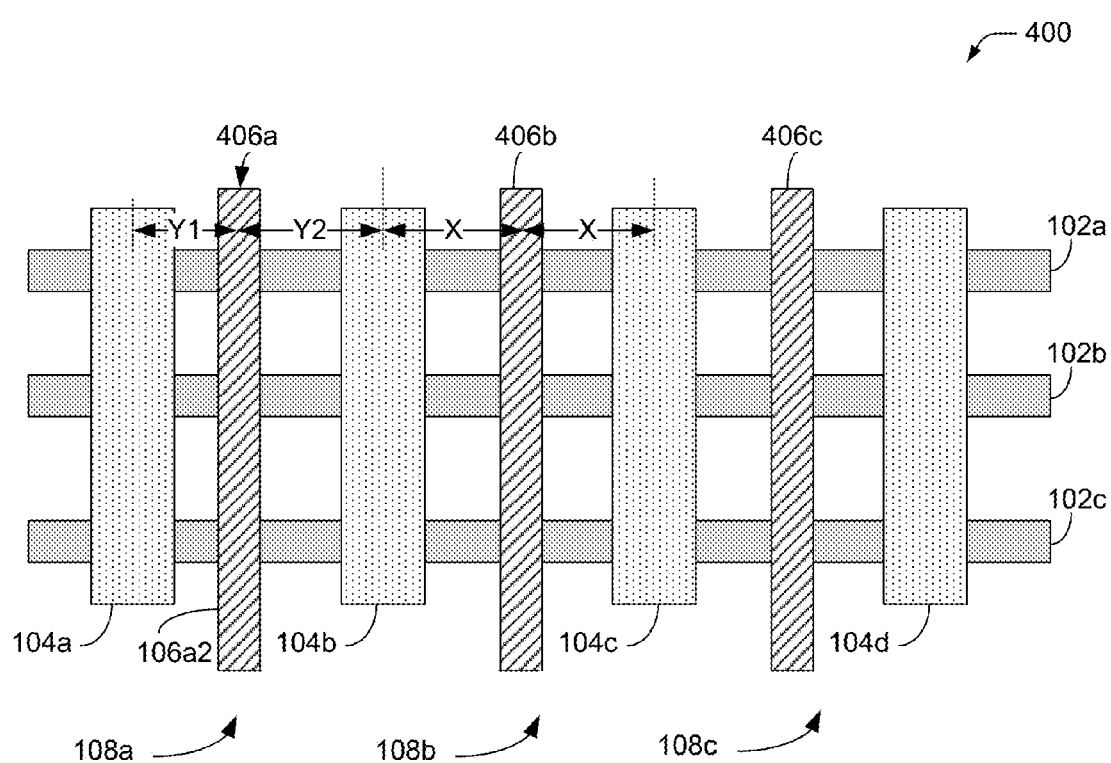

FIGS. 4A and 4B illustrate the device 100, with sections of the gate layer 106a being cut. FIG. 4A illustrate jog lines 402a and 402b being superimposed over the device 100. The jog lines 402a and 402b may be formed, for example, on the design 200 of FIG. 2. The jog lines 402a and 402b encapsulate portions of the gate layers 106a, ..., 106c. For example, the jog lines 402a and 402b encapsulate portions of the section 106a1 and 106a3, respectively, of the gate layers 106a. In an example, the jog lines 402a and 402b encapsulate the boundary between the sections 160a1 and 160a2, and the boundary between the sections 160a2 and 160a3, respectively, of the gate layer 106a.

As illustrated in FIG. 4B, the gate layers 106a, ..., 106c are cut along the jog lines 402a and 402b. The resultant device 400 of FIG. 4B has gate layers 406a, 406b and 406c, which are formed by cutting the gate layers 106a, ..., 106c, respectively. The gate layer 406a corresponds to the section 106a2 of the device 100 of FIG. 1 (e.g., as the sections 106a1 and 106a3 are cut). That is, the gate layer 406a is formed by separating the section 106a2 from other sections of the gate layer 106a, such that the gate layer 406a comprises at least a part of only the section 106a2. In one embodiment, the gate layer 406a is linearly shaped.

Similar to FIG. 1, the gate layer 406b is at a distance X from each of the adjacent contacts 104b and 104c. The gate layer 406a is at the distance Y1 from the adjacent source contact 104a of the transistor 108a, and is at the distance Y2 from the adjacent drain contact 104b of the transistor 108b. As previously discussed with respect to FIG. 1, the parasitic contact between the gate layer 406a and the drain contact 108b of the transistor 108a in FIG. 4 is relatively less (e.g., due to the distance Y2 being higher than the distance Y1), thereby leading to an improved performance of the transistor 108a of the device 400.

Figure 5:
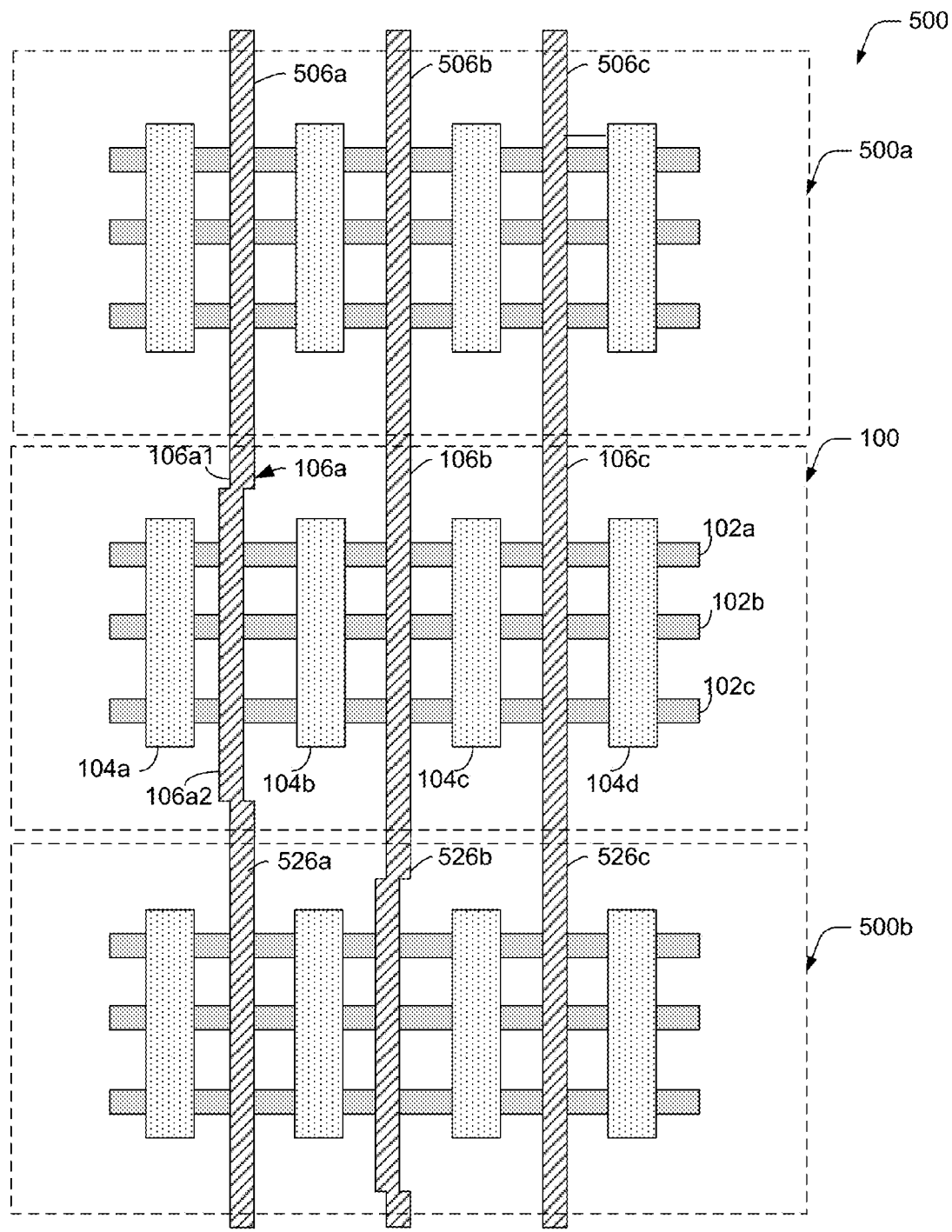
FIG. 5 schematically illustrates a top view of a device comprising a plurality of semiconductor devices.

FIG. 5 schematically illustrates a top view of a device 500 comprising a plurality of semiconductor devices. For example, the device 500 comprises the device 100 of FIG. 1, and also semiconductor devices 500a and 500b. Each of the semiconductor devices 500a and 500b are at least in part similar to the device 100 of FIG. 1. For example, each of the semiconductor devices 500a and 500b comprises a plurality of diffusion layers, a plurality of contacts, and a plurality of gate layers (for purposes of clarity, some of these components are not labeled in FIG. 5). For example, the device 500a comprises gate layers 506a, 506b and 506c, and the device 500b comprises gate layers 526a, 526b and 526c.

As illustrated in FIG. 5, a gate layer of one of the semiconductor devices 100, 500a and 500b is coupled to a corresponding gate layer of an adjacent semiconductor device. For example, the gate layers 506a, 106a and 526a are coupled or connected, resulting in a continuous gate layer. In an embodiment, the gate layers 506a, 106a and 526a are formed together, e.g., using a single mask layer, as discussed with respect to FIGS. 3C-3E.

In the example of FIG. 5, none of the gate layers 506a, 506b and 506c of the semiconductor device 500a is non-linear, while the gate layer 526b of the semiconductor device 500b is non-linear. Although not illustrated in FIG. 5, in an embodiment, the gate layers between two adjacent semiconductor devices may be cut or segregated subsequent to the formation of the device 500, e.g., as discussed with respect to FIGS. 4A and 4B.

As illustrated in FIG. 5, the sections 106a1 and 106a3 of the gate layer 106a of the device 100 are connected to corresponding gate layers of adjacent semiconductor devices 500a and 500b, respectively. Accordingly, it is not possible to entirely shift the gate layer 106a towards the contact 104a (e.g., instead of making the gate layer 106a non-linear). Put differently, as the sections 106a1 and 106a3 of the gate layer 106a of the device 100 are connected to corresponding gate layers of adjacent semiconductor devices 500a and 500b, respectively, the sections 106a1 and 106a3 of the gate layer 106a cannot be shifted towards the contact 104a. Accordingly, in the example of FIGS. 1 and 5, only the middle section 106a2 of the gate layer 106a is shifted towards the contact 104a, thereby resulting in the non-linear shape of the gate layer 106a.

Figure 6:
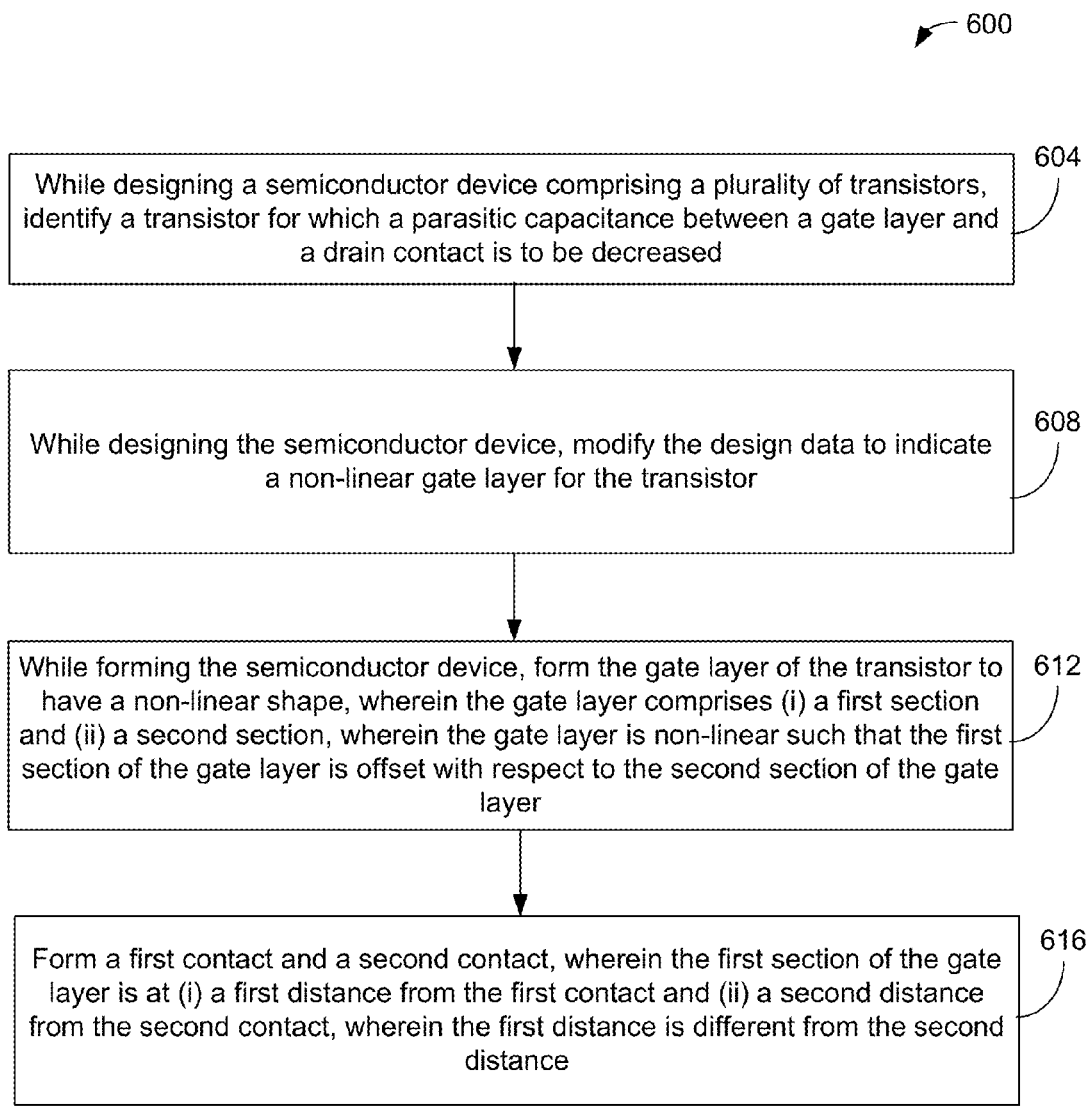
FIG. 6 is a flow diagram of an example method of formation of a semiconductor device.

FIG. 6 is a flow diagram of an example method 600 for forming a semiconductor device (e.g., the devices 100 and 400 of FIGS. 1 and 4, respectively). At 604, while designing a semiconductor device comprising a plurality of transistors, a transistor (e.g., the transistor 108a of the device 100) for which a parasitic capacitance between a gate layer and a drain contact is to be decreased is identified. In an example, the identified transistor is used for high frequency switching operation.

At 608, while designing the semiconductor device, the design data is modified to indicate a non-linear gate layer (e.g., gate layer 106a of FIG. 1) for the transistor. For example, in the design data, a flag with an appropriate value and/or a linearity indication layer is associated with the gate layer of the transistor to indicate the non-linear shape of the gate layer.

At 612, while forming the semiconductor device, the gate layer of the transistor is formed to have a non-linear shape. In an example, the gate layer comprises (i) a first section (e.g., section 106a2 of the gate layer 106a) and (ii) a second section (e.g., section 106a1 of the gate layer 106a), and the gate layer is non-linear such that the first section of the gate layer is offset with respect to the second section of the gate layer.

At 616, a first contact (e.g., contact 104a of FIG. 1) and a second contact (e.g., contact 104b of FIG. 1) are formed. In an example, the first section of the gate layer is at (i) a first distance (e.g., distance Y1) from the first contact and (ii) a second distance (e.g., distance Y2) from the second contact, and the first distance is different from the second distance. In an example, the first distance is less than the second distance. In an example, based on the first distance being less than the second distance, a parasitic or Miller capacitance between the gate layer and the second contact is less than a parasitic or Miller capacitance between the gate layer and the first contact.

The description may use the phrases "in an embodiment," or "in embodiments," which may each refer to one or more of the same or different embodiments. The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Although certain embodiments have been illustrated and described herein, a wide variety of alternate and/or equivalent embodiments or implementations calculated to achieve the same purposes may be substituted for the embodiments illustrated and described without departing from the scope of the present invention. This application is intended to cover any adaptations or variations of the embodiments discussed herein. Therefore, it is manifestly intended that embodiments in accordance with the present invention be limited only by the claims and the equivalents thereof.

What is claimed is:

1. A semiconductor device comprising:
   a gate layer comprising (i) a first section and (ii) a second section, wherein the gate layer is non-linear such that the first section of the gate layer is offset with respect to the second section of the gate layer, and wherein the first section of the gate layer and the second section of the gate layer form a continuous section of the gate layer; and
   a first contact, a second contact, a third contact, and a fourth contact,
   wherein the first section of the gate layer is at (i) a first distance from the first contact and (ii) a second distance from the second contact, wherein the first distance is different from the second distance,
   wherein the second section of the gate layer is substantially at a third distance from each of the third contact and the fourth contact,
   wherein at least a part of the first section of the gate layer is included in a first transistor,
   wherein at least a part of the second section of the gate layer is included in a second transistor, and
   wherein the second transistor is different from and adjacent to the first transistor.

2. The semiconductor device of claim 1, wherein the second section of the gate layer is substantially at a same distance from each of the first contact and the second contact.

3. The semiconductor device of claim 1, wherein:
   the gate layer further comprises a third section; and
   the first section of the gate layer is offset with respect to the third section of the gate layer.

4. The semiconductor device of claim 3, wherein:
   the second section of the gate layer is linear with respect to the third section of the gate layer.

5. The semiconductor device of claim 1, wherein:
   the first contact is a drain contact of a transistor; and
   the second contact is a source contact of the transistor.

6. The semiconductor device of claim 5, wherein:
   based on the first contact being the drain contact and the second contact being the source contact of the transistor, the first distance is higher than the second distance.

7. The semiconductor device of claim 1, wherein:
   the first contact is electrically coupled to a drain region of the first transistor; and
   the second contact is electrically coupled to a source region the first transistor.

8. The semiconductor device of claim 7, wherein the first transistor comprises (i) the drain region, (ii) the first contact coupled to the drain region, (iii) the source region, (iv) the second contact coupled to the source region, and (v) at least the part of the first section of the gate layer.

9. The semiconductor device of claim 1, wherein:
a first parasitic capacitance is generated between the gate layer and the first contact;
a second parasitic capacitance is generated between the gate layer and the second contact; and
based on the non-linear shape of the gate layer, the first parasitic capacitance is different from the second parasitic capacitance.

10. A semiconductor device comprising:
a first gate layer comprising (i) a first section and (ii) a second section, wherein the first gate layer is non-linear such that the first section of the first gate layer is offset with respect to the second section of the first gate layer;
a first contact and a second contact, wherein the first section of the gate layer is at (i) a first distance from the first contact and (ii) a second distance from the second contact, wherein the first distance is different from the second distance;
a second gate layer, wherein the second gate layer is linearly shaped; and
a third contact,
wherein the second gate layer is at substantially a same distance from each of the second contact and the third contact.

11. A method of forming a semiconductor device, comprising:
forming a gate layer, wherein the gate layer comprises (i) a first section and (ii) a second section, wherein the gate layer is non-linear such that the first section of the gate layer is offset with respect to the second section of the gate layer, and wherein the first section of the gate layer and the second section of the gate layer form a continuous section of the gate layer;
forming a first contact, a second contact, a third contact, and a fourth contact, wherein the first section of the gate layer is at (i) a first distance from the first contact and (ii) a second distance from the second contact, wherein the first distance is different from the second distance, wherein the second section of the gate layer is at a third distance from each of the third contact and the fourth contact;
forming a first transistor such that at least a part of the first section of the gate layer is included in the first transistor; and
forming a second transistor such that at least a part of the second section of the gate layer is included in the second transistor, wherein the second transistor is different from and adjacent to the first transistor.

12. The method of claim 11, wherein the second section of the gate layer is substantially at a same distance from each of the first contact and the second contact.

13. The method of claim 11, wherein:
the gate layer further comprises a third section;
the first section of the gate layer is offset with respect to the third section of the gate layer; and
the second section of the gate layer is linear with respect to the third section of the gate layer.

14. The method of claim 11, further comprising:
forming a drain region of the first transistor, wherein the first contact is a drain contact that is electrically coupled to the drain region; and
forming a source region of the first transistor, wherein the second contact is a source contact that is electrically coupled to the source region,
wherein based on the first contact being the drain contact and the second contact being the source contact of the first transistor, the first distance is higher than the second distance.

15. A method of forming a semiconductor device, comprising:
while designing the semiconductor device, assigning a first value to a flag in a design of the semiconductor device, wherein the flag is associated with a gate layer, and wherein the first value indicates that the gate layer is to be non-linear and to be skewed towards a first contact;
based on the first value being assigned to the flag associated with the gate layer, forming the gate layer such that (i) the gate layer comprises the first section and a second section, (ii) the gate layer is non-linear such that the first section of the gate layer is offset with respect to the second section of the gate layer, and (iii) the first section of the gate layer is skewed towards the first contact; and
forming the first contact and a second contact, wherein the first section of the gate layer is at (i) a first distance from the first contact and (ii) a second distance from the second contact, wherein the first distance is different from the second distance.

16. A method of forming a semiconductor device, comprising:
while designing the semiconductor device and in a design of the semiconductor device, associating a linearity indication layer with a gate layer and a first contact;
based on the linearity indication layer being associated with the gate layer and the first contact, forming the gate layer such that (i) the gate layer comprises the first section and a second section, (ii) the gate layer is non-linear such that the first section of the gate layer is offset with respect to the second section of the gate layer, and (iii) the first section of the gate layer is skewed towards the first contact; and
forming the first contact and a second contact, wherein the first section of the gate layer is at (i) a first distance from the first contact and (ii) a second distance from the second contact, wherein the first distance is different from the second distance.

17. The method of claim 16, wherein the linearity indication layer comprises an optical proximity correction (OPC) optimization layer.

18. A method of forming a semiconductor device, comprising:
forming a gate layer, wherein the gate layer comprises (i) a first section and (ii) a second section, wherein the gate layer is non-linear such that the first section of the gate layer is offset with respect to the second section of the gate layer; and
forming a first contact and a second contact, wherein the first section of the gate layer is at (i) a first distance from the first contact and (ii) a second distance from the second contact, wherein the first distance is different from the second distance,
wherein forming the gate layer comprises
forming a plurality of diffusion layers,
forming a first layer over the plurality of diffusion layers,
masking at least a part of the first layer using a first mask, wherein a shape of the first mask corresponds to a shape of the gate layer,
subsequent to masking at least the part of the first layer, etching portions of the first layer that is not masked, and
subsequent to etching portions of the first layer, etching the first mask to form the gate layer.

19. A method of forming a semiconductor device, comprising:
- forming a gate layer, wherein the gate layer comprises (i) a first section and (ii) a second section, wherein the gate layer is non-linear such that the first section of the gate layer is offset with respect to the second section of the gate layer;
- forming a first contact and a second contact, wherein the first section of the gate layer is at (i) a first distance from the first contact and (ii) a second distance from the second contact, wherein the first distance is different from the second distance; and
- forming a modified gate layer from the gate layer such that the modified gate layer comprises at least a part of the first section of the gate layer, wherein the modified gate layer does not include the second section of the gate layer.

20. A method of forming a semiconductor device, comprising:
- forming a first gate layer, wherein the first gate layer comprises (i) a first section and (ii) a second section, wherein the first gate layer is non-linear such that the first section of the first gate layer is offset with respect to the second section of the first gate layer; and
- forming a first contact and a second contact, wherein the first section of the first gate layer is at (i) a first distance from the first contact and (ii) a second distance from the second contact, wherein the first distance is different from the second distance,
- forming a second gate layer, wherein the second gate layer is linearly shaped; and
- forming a third contact, wherein the second gate layer is at substantially a same distance from each of the second contact and the third contact.

* * * * *